United States Patent
Sestok et al.

(10) Patent No.: US 8,547,260 B2
(45) Date of Patent: Oct. 1, 2013

(54) COMPRESSIVE SENSE BASED RECONSTRUCTION ALGORITHM FOR NON-UNIFORM SAMPLING BASED DATA CONVERTER

(75) Inventors: Charles K. Sestok, Dallas, TX (US); Andrew Waters, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1 day.

(21) Appl. No.: 13/234,297

(22) Filed: Sep. 16, 2011

(65) Prior Publication Data

US 2013/0069807 A1    Mar. 21, 2013

(51) Int. Cl.
*H03M 1/00* (2006.01)

(52) U.S. Cl.
USPC .......................... 341/122; 341/155

(58) Field of Classification Search
USPC .......................... 341/122, 124, 155
See application file for complete search history.

(56) References Cited

U.S. PATENT DOCUMENTS

| | | | |
|---|---|---|---|
| 7,324,036 B2 | 1/2008 | Petre et al. | |
| 7,345,603 B1 * | 3/2008 | Wood et al. | 341/122 |
| 7,463,179 B2 * | 12/2008 | Brady et al. | 341/155 |
| 7,834,795 B1 | 11/2010 | Dudgeon et al. | |
| 7,965,216 B1 * | 6/2011 | Petre et al. | 341/155 |
| 2011/0191400 A1 * | 8/2011 | Das Gupta et al. | 708/446 |

OTHER PUBLICATIONS

"Compressive Sampling With a Successive Approximation ADC Architecture," International Conference on Acoustics, Speech, and Signal Processing (ICASSP), Prague, Czech Republic, May 2011, pp. 3920-3923 (Luo, et al.).
"Theory and Implementation of an Analog-to-Information Converter using Random Demodulation," IEEE Intl. Symposium on Circuits and Systems, May 27-30, 2007, pp. 1959-1962 (Laska, et al.).
"Sampling Rate Reduction for 60 GHz UWB Communication Using Compressive Sensing," Asilomar Conference on Signals, Systems & Computers, 2009, pp. 1125-1129 (Meng, et al.).
"Compressive Sensing Using Random Demodulation." Master Thesis by Benjamin Scott Boggess, (2009).
"An Introduction to Compressive Sensing," IEEE SP Magazine, Mar. 2008 (Candes, et al.).
"Beyond Nyquist: Efficient Sampling of Sparse Bandlimited Signals", IEEE Transactions on Information Theory, Jan. 2010 (Tropp, et al.).
"A Sub-Nyquist Rate Sampling Receiver Exploiting Compressive Sensing", IEEE Transactions on Circuits and Systemes-I, Reg. Papers, Mar. 2011 (Chen, et al.).

(Continued)

*Primary Examiner* — Brian Young
(74) *Attorney, Agent, or Firm* — Alan A. R. Cooper; W. James Brady, III; Frederick J. Telecky, Jr.

(57) ABSTRACT

Compressive sensing is an emerging field that attempts to prevent the losses associated with data compression and improve efficiency overall, and compressive sensing looks to perform the compression before or during capture, before energy is wasted. Here, a reconstruction algorithm is proposed for a compressive sensing successive approximation register (SAR) analog-to-digital converter (ADC). Accordingly, an analog signal is converted to a first digital signal at a sampling frequency that is less than a Nyquist frequency for the analog signal, and a second digital signal is constructed from the first digital signal with a box constrained linear optimization process such that the second digital signal is approximately equal to an analog-to-digital conversion of the analog signal at the Nyquist frequency for the analog signal.

8 Claims, 2 Drawing Sheets

(56) References Cited

OTHER PUBLICATIONS

"Compressive sensing," Lecture notes in IEEE Signal Processing Magazine, 24(4):118-120, 2007 (Baraniuk).
"Blind Multi-band Signal Reconstruction: Compressed Sensing for Analog Signals," IEEE Trans. Signal Proc., 2007 (Mishali, et al.).
"On Sparse Reconstruction from Fourier and Gaussian Measurements," Communication on Pure and Applied Mathematics, pp. 1-18 (Rudelson, et al.), (2007).
"Random Filters for Compressive Sampling and Reconstruction," IEEE Int. Conf. on Acoustics, Speech and Signal Processing (ICASSP), vol. III, pp. 872-875 (Tropp, et al.), (2006).
SPGL1: A Solver for Large-Scale Sparse Reconstruction, Jun. 2007.
"Probing the Pareto Frontier for Basis Pursuit Solutions," SIAM J. Sci. Comput. 2008 Society for Industrial and Applied Mathematics vol. 31, No. 2, pp. 890-912 (van den Berg, et al.), (2008).
"Compressed Sensing with Coherent and Redundant Dictionaries," Applied and Computational Harmonic Analysis, 2010, pp. 59-73 (Candes, et al.).
"Spectral Compressive Sensing," Department of Electrical and Computer Engineering, University of masschusetts, Amherst, MA, Aug. 17, 2011, pp. 2-28 (Duarte, et al.).
"Signal Recovery from Partial Information Via Orthogonal Matching Pursuit," IEEE Trans. Info Theory, 53 (12);4655-4666, Dec. 2007, (Tropp, et al.).
"A Bit-Constrained SAR ADC for Compressive Acquisition of Frequency Sparse Signals," Rice University (Waters, et al.), (2012).
U.S. Appl. No. 13/106,585, filed May 12, 2011.
U.S. Appl. No. 13/323,578, filed Dec. 12, 2011.

* cited by examiner

COMPRESSIVE SENSE BASED RECONSTRUCTION ALGORITHM FOR NON-UNIFORM SAMPLING BASED DATA CONVERTER

TECHNICAL FIELD

The invention relates generally to analog-to-digital converters (ADCs) and, more particularly, to compressive sensing ADCs (CS-ADCs).

BACKGROUND

Digital compression has become ubiquitous and has been used in a wide variety of applications (such as video and audio applications). When looking to image capture (i.e., photography) as an example, an image sensor (i.e., charged-coupled device or CCD) is employed to generate analog image data, and an ADC is used to convert this analog image to a digital representation. This type of digital representation (which is raw data) can consume a huge amount of storage space, so an algorithm is employed to compress the raw (digital) image into a more compact format (i.e., Joint Photographic Experts Group or JPEG). By performing the compression after the image has been captured and converted to a digital representation, energy (i.e., battery life) is wasted. This type of loss is true for nearly every application in which data compression is employed.

Compressive sensing is an emerging field that attempts to prevent the losses associated with data compression and improve efficiency overall. Compressive sensing looks to perform the compression before or during capture, before energy is wasted. To accomplish this, one should look to adjusting the theory under which the ADCs operate, since the majority of the losses are due to the data conversion. For ADCs to perform properly under conventional theories, the ADCs should sample at twice the highest rate of the analog input signal (i.e., audio signal), which is commonly referred to as the Shannon-Nyquist rate or Nyquist frequency. Compressive sensing should allow for a sampling rate well-below the Shannon-Nyquist rate so long as the signal of interest is sparse in some arbitrary representing domain and sampled or sensed in a domain which is incoherent with respect to the representation domain.

As is apparent, a portion of compressive sensing is devoted to reconstruction (usually in the digital domain) after resolution; an example of which is described below with respect to a successive approximation register (SAR) ADC and in Luo et al., "Compressive Sampling with a Successive Approximation ADC Architecture," 2011 *Intl. Conf. on Acoustic Speech and Signal Processing (ICASSP)*, pp 2590-2593. For the compressive sensing framework, a signal $\vec{y}$ can be expressed as:

$$\vec{y} = \overline{\Phi\Psi}\vec{\alpha} = \overline{A}\vec{\alpha}, \qquad (1)$$

where $\vec{\alpha}$ (which satisfies the condition $\vec{\alpha} \in \Re^N$) is a frequency sparse signal, $\overline{\Psi}$ is the inverse fast Fourier transform or IFFT basis matrix (which maps frequency sparse signal $\vec{\alpha}$ to the time domain), $\overline{\Phi}$ is a row restriction of the identity matrix that provides M samples from a random set $\Omega$ (or $\overline{\Phi} = \overline{1}_{i\Omega} \in \Re^{M \times N}$), and $\overline{A}$ is a measurement matrix. The measurement-matrix $\overline{A}$ should obey the restricted isometry property (RIP) with high probability as long as the number of measurements or samples M is sufficiently large. With a SAR ADC having J stages, the total error $e_m$ is:

$$e_m = e_t + e_q, \qquad (2)$$

where $e_q$ is the quantization error and $e_t$ is the truncation error when stopping at m stages. The quantization error $e_q$ lies with the range of $-V_{REF}/2^J$ and $V_{REF}/2^J$, where $V_{REF}$ is a reference voltage, while the truncation error $e_t$ lies between 0 and $$\frac{2^{J-m}-1}{2^J} V_{REF}.$$

Thus, from equation (2) above, the total error $e_m$ becomes:

$$e_m \in \left[\frac{-1}{2^J} V_{REF}, \frac{2^{J-m}}{2^J} V_{REF}\right] \qquad (3)$$

Using the upper and lower bounds of the total error $e_t$, the difference between an analog signal y and quantized samples $y_q$ is between these bounds, which means (using equation (1) above) that the input signal can be recovered solving:

$$\min |\vec{\alpha}|_0 \qquad (4)$$

subject to $$\|\overline{W}(\vec{y} - \overline{A}\vec{\alpha})\|_2 \leq \sqrt{M} \qquad (5)$$

where $\overline{W}$ is a diagonal weighting matrix with $W_{ii} = 1/e_i$ and $e_i$ is the maximal quantization error. The purpose of the weighting matrix $\overline{W}$ is to steer reconstruction towards a solution that agrees more closely with high precision samples rather than low precision samples. This solution (which is usually referred to as a quadratically constrained linear program) under many circumstances may be adequate, but, for other situations, more accuracy may be necessary. Therefore, there is a need for a more accurate reconstruction methodology or algorithm.

Some conventional circuits and systems are: U.S. Pat. No. 7,324,036; U.S. Pat. No. 7,834,795; Laska et al., "Theory and Implementation of an Analog-to-Information Converter Using Random Demodulation," *IEEE Intl. Symposium on Circuits and Systems*, May 27-30, 2007, pp. 1959-1962; Meng et al., "Sampling Rate Reduction for 60 GHz UWB Communication Using Compressive Sensing," *Asilomar Conference on Signals, Systems & Computers*, 2009; Benjamin Scott Boggess, "Compressive Sensing Using Random Demodulation" (Master's Thesis), 2009; Candes et al., "An Introduction to Compressive Sensing," *IEEE SP Magazine*, March 2008; Tropp et al., "Beyond Nyquist: Efficient Sampling of Sparse Bandlimited Signals", *IEEE Transactions on Information Theory*, January 2010; Chen et al., "A Sub-Nyquist Rate Sampling Receiver Exploiting Compressive Sensing", *IEEE Transactions on Circuits and Systemes-I, Reg. Papers*, March 2011; R. Baraniuk, "Compressive sensing," *Lecture notes in IEEE Signal Processing Magazine*, 24(4):118-120, 2007; Y. Eldar, "Compressed sensing for analog signals," *IEEE Trans. Signal Proc.*, 2008. submitted; Luo et al., "Compressive Sampling with a Successive Approximation ADC Architecture," 2011 *Intl. Conf. on Acoustic Speech and Signal Processing (ICASSP)*, pp 2590-2593; Mishali et al., "Blind multi-band signal reconstruction: Compressed sensing for analog signals" *IEEE Trans. Signal Proc.*, 2007. submitted; Rudelson et al., "On sparse reconstruction from Fourier and Gaussian measurements," *Communications on Pure and Applied Mathematics*, 61(8):1025-1045, 2008; J. Tropp, M. B. Wakin, M. F. Duarte, D. Baron, and R. G. Baraniuk. Random Filters for compressive sampling and reconstruction," IEEE Int. *Conf. on Acoustics, Speech and*

Signal Processing (ICASSP), volume III, pages 872-875, Toulouse, France, May 2006. submitted; van den Berg et al., "SPGL1: A solver for large-scale sparse reconstruction," June 2007, http://www.cs.ubc.ca/labs/scl/spgl1; and van den Berg et al. "Probing the pareto frontier for basis pursuit solutions," SIAM Journal on Scientifc Computing, 31(2):890-912, 2008.

SUMMARY

A preferred embodiment of the present invention, accordingly, provides an apparatus. The apparatus comprises an analog-to-digital converter (ADC) that is configured to generate a first digital signal from an analog signal; and a controller that is coupled to the ADC so as to provide a sample signal to the ADC and to receive the first digital signal from the ADC, wherein the frequency of the sample signal is less than a Nyquist frequency for the analog signal, and wherein the controller generates a second digital signal from the first digital signal by employing a box constrained linear optimization process, and wherein the second digital signal is approximately equal to an analog-to-digital conversion of the analog signal at the Nyquist frequency for the analog signal.

In accordance with an embodiment of the present invention, the ADC further comprises a successive approximation register (SAR) ADC.

In accordance with an embodiment of the present invention, the SAR ADC further comprises: a sample-and-hold (S/H) circuit that is configure to receive analog signal and the sample signal; a comparator that is coupled to the S/H circuit; SAR logic that is coupled to the comparator and the controller; and a capacitive digital-to-analog converter (CDAC) that is coupled to the SAR logic and the comparator.

In accordance with an embodiment of the present invention, the controller provides a clocks signal to the SAR logic and the comparator.

In accordance with an embodiment of the present invention, the box constrained linear optimization processes minimizes a frequency sparse signal ($\vec{\alpha}$) subject to the following constraint:

$$|y_i - (\vec{A}\vec{\alpha})_i| \le e_{i,\ i=1,\ldots,M}$$

where y is the second digital signal, $\overline{A}$ is the measurement matrix, e is an error, and M is the number of measurements.

In accordance with an embodiment of the present invention, the controller further comprises a processor having a memory with a computer program embodied thereon.

In accordance with an embodiment of the present invention, a method is provided. The method comprises converting an analog signal to a first digital signal at a sampling frequency that is less than a Nyquist frequency for the analog signal; and constructing a second digital signal from the first digital signal with a box constrained linear optimization process such that the second digital signal is approximately equal to an analog-to-digital conversion of the analog signal at the Nyquist frequency for the analog signal.

In accordance with an embodiment of the present invention, the step of converting further comprises: sampling the analog signal at a plurality of sampling instants; and determining a digital value for the analog signal at each sampling instant by successive approximation.

In accordance with an embodiment of the present invention, the sampling instants occur as non-uniform intervals.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
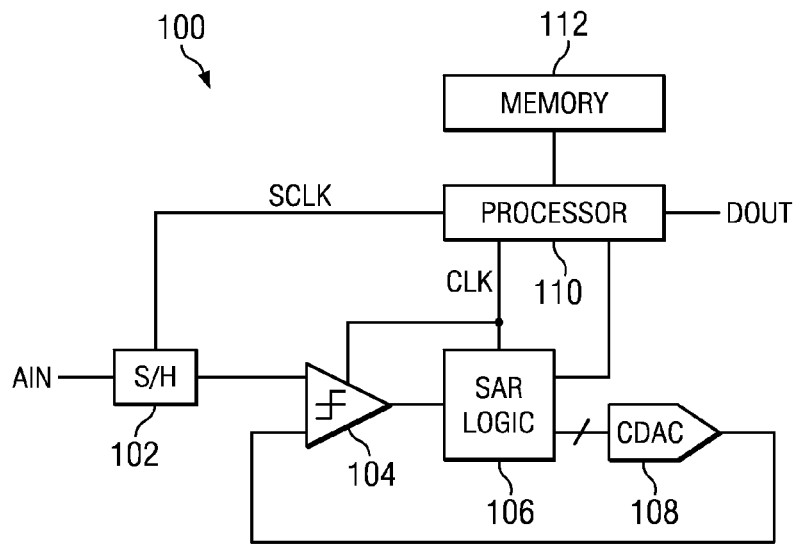
FIG. 1 is a diagram of an example of a system in accordance with an embodiment of the present invention.

Refer now to the drawings wherein depicted elements are, for the sake of clarity, not necessarily shown to scale and wherein like or similar elements are designated by the same reference numeral through the several views.

Turning to FIG. 1, an example of a system 100 that employs a CS-SAR ADC can be seen. In this example, the SAR ADC generally comprises a sample-and-hold (S/H) circuit 102, a comparator 104, SAR logic 106, and capacitive digital-to-analog converter (CDAC) 108, and the controller generally comprises processor 110 (which can, for example, be a digital signals processor or DSP) and memory 112. In operation, the SAR logic 106 selects the resolution for the conversion of each sample from the S/H circuit 102 (which can, for example, be an S/H amplifier) substantially at random. The comparator 104 operates on the clock signal CLK (which is generated by processor 110 or a timing circuit within the controller and which has a period $T_{CLK}$ that is less than the period $T_{SCLK}$ of the sample clock signal SCLK) so as (for example) to resolve one bit per cycle or period TCLK, and the processor 110 adjusts the period $T_{SCLK}$ with the selected resolutions. Additional details about this system 100 can be found in co-pending U.S. patent application Ser. No. 13/106,585, which is entitled "COMPRESSIVE SENSING ANALOG-TO-DIGITAL CONVERTERS," which was filed on May 12, 2011, and which is incorporated by reference for all purposes.

Figure 2:
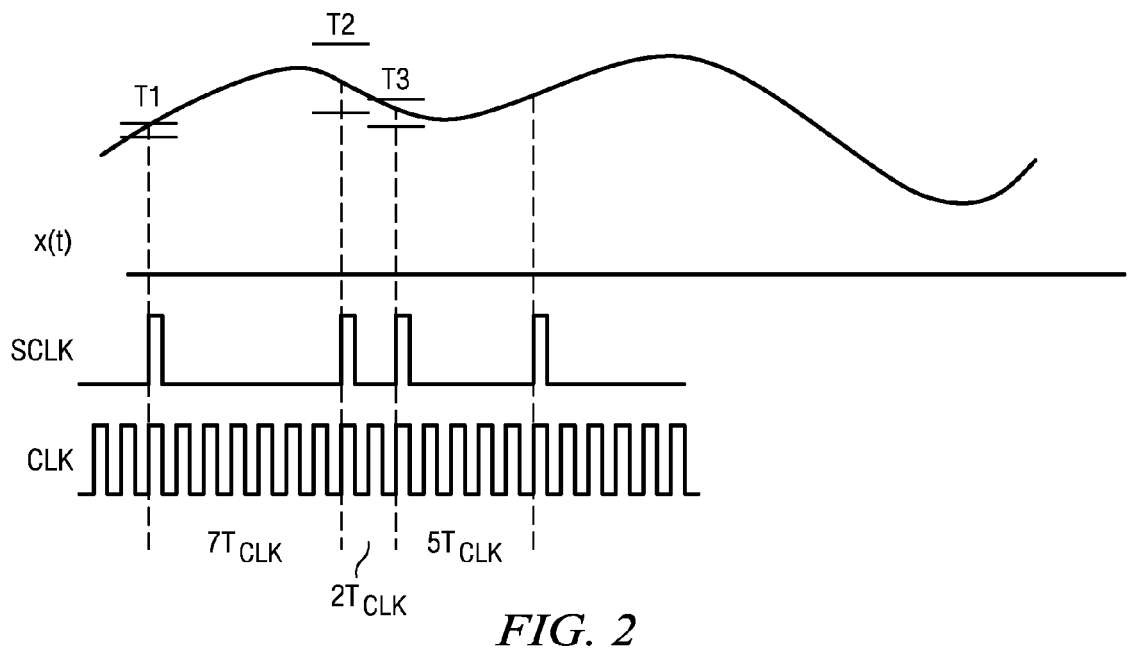
FIG. 2 is a diagram depicting an example operation of the system of FIG. 1.

As shown in the example of FIG. 2, three samples from analog input signal AIN are resolved by system 100. For the first sample (at sampling instant T1), the SAR logic 106 selects a resolution of 6 or +/−REF/128. At sampling instant T1, the sample clock signal SCLK (which is generally aligned with clock signal CLK) would cause the S/H circuit 102 to sample the analog input signal AIN, and, on the following rising edge of the clock signal CLK, the quantization loop of system 100 would resolve the sample from sampling instant T1 to a resolution of +/−REF/128 over six iterations. After resolution of the first sample (i.e., after 7 $T_{CLK}$), the processor 110 (or timing circuit) would generate a pulse in the sample clock signal SCLK which would correspond to sampling instant T2. For the sample at sampling instant T2, the SAR logic 106 selects the resolution to be 1 or +/−REF/4, and the quantization loop for system 100 performs the conversion on the next rising edge of clock signal CLK, resulting in a resolution period for the sample at instant T2 to be 2 $T_{CLK}$. Following the resolution of the second sample at instant T2, the system 100 resolves a third sample at instant T3 to a resolution of 4 or +/−REF/32 over 5 $T_{CLK}$. Thus, as can be seen, the analog input signal x(t) is sampled irregularly based on the resolution selected substantially at random.

In order to build the digital signal DOUT, the processor 110 employs a reconstruction algorithm, and this algorithm is more accurate than the quadratically constrained linear program described above. Specifically, the processor 110 employs a box constrained optimization process. This can be accomplished in hardware or in software, but it is usually accomplished in software as a computer program that is embodied on the processor 110 and memory 112. The box constrained optimization process attempts to minimize frequency sparse signal $\vec{\alpha}$ (as in equation (4) above), but it is subject to the following constraint:

$$|y_i - (\overline{A}\vec{\alpha})_i| \le e_i, i=1,\ldots,M \quad (6)$$

Essentially from equation (6), each measurement is constrained to lie within an appropriate distance from the reconstructed signal. By taking this approach, nearly one extra bit of ENOB or effective number of bits can be gained over use of the weighing matrix $\overline{W}$ of quadratically constrained linear program described above. This approach, however, does add computational complexity in that multiple (i.e., M) constraints are employed as opposed to one; typically, there is one constraint for each measurement of the system 100. This allows the digital signal DOUT (which is approximately equal to an analog-to-digital conversion of the analog input signal AIN at the Nyquist frequency) to be constructed from the digital signal from the SAR logic 106.

Figure 3:
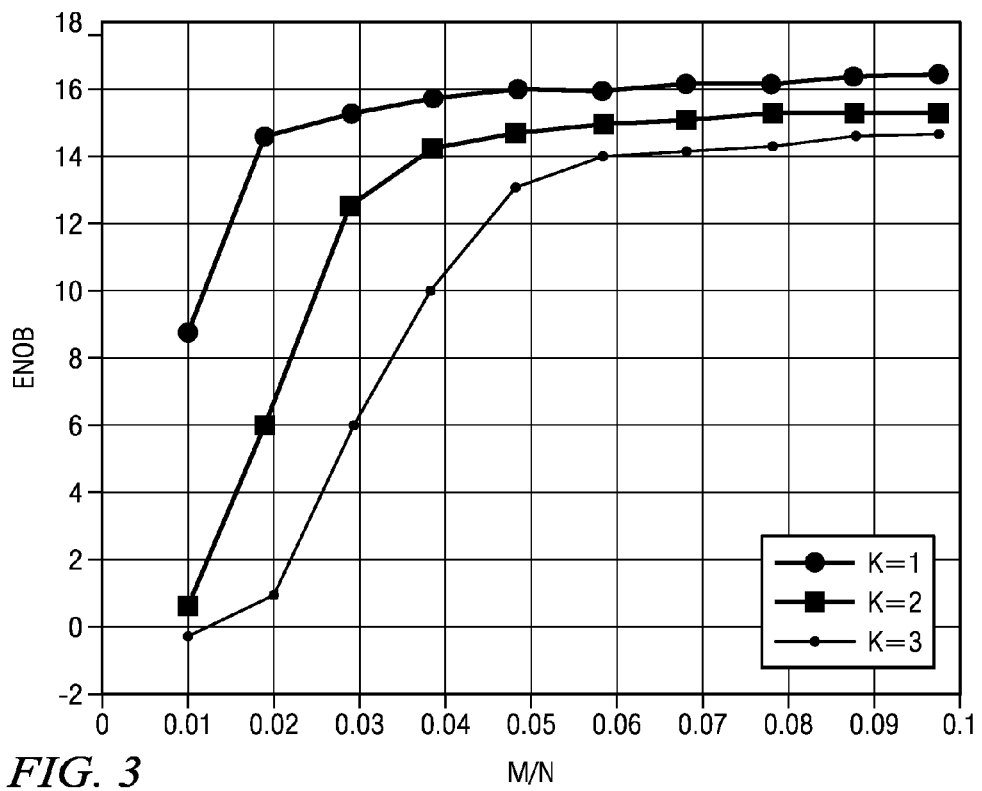
FIGS. 3 and 4 are diagrams depicting the performance of the reconstruction algorithm employed in the system of FIG. 1.
Figure 4:
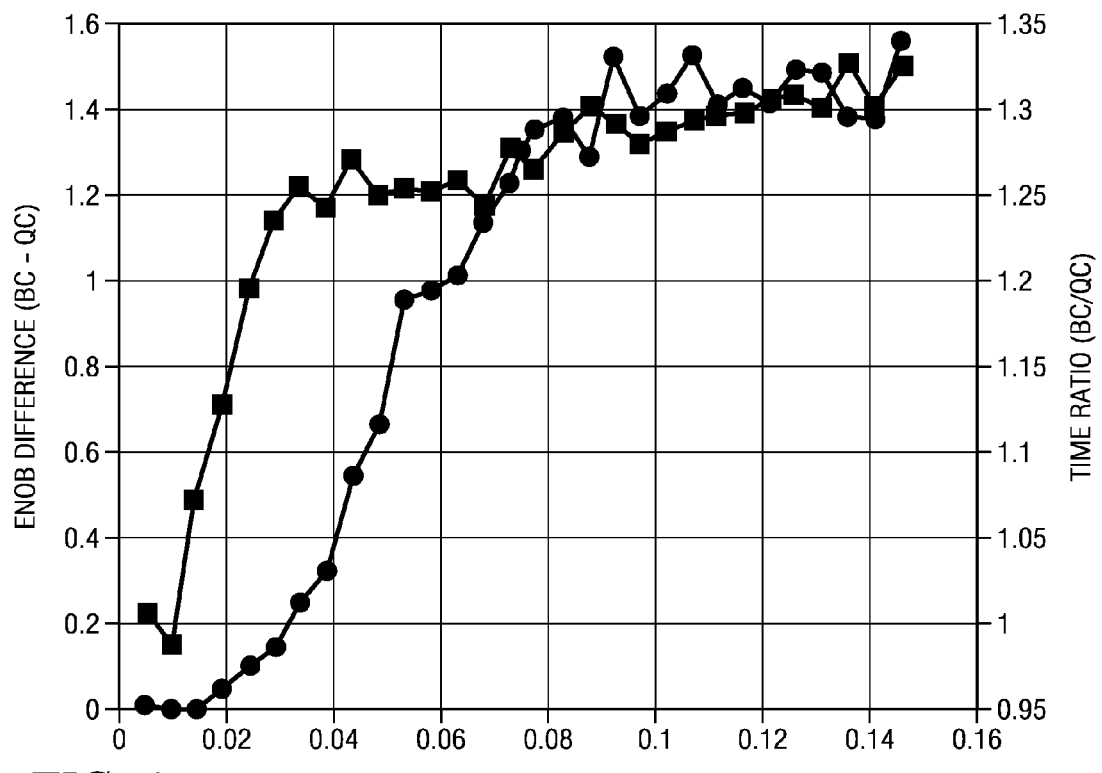

Turning to FIGS. 3 and 4, examples of the performance of system 100 can be observed. In each of these examples, a 16-bit SAR ADC is employed. As shown in FIG. 3, reconstruction is shown as a function of sparsity and compression, and FIG. 4 shows a comparison between the use of the box constrained optimization process and the quadratically constrained linear program. The system 100 is able to achieve excellent performance at a compression ratio of 20 to 1, and the system 100 is able to achieve nearly a full decibel of ENOB for a roughly 30% increase in runtime to convergence (or a 30% increase in computational complexity).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an analog-to-digital converter (ADC) that is configured to generate a first digital signal from an analog signal; and
   a controller that is coupled to the ADC so as to provide a sample signal to the ADC and to receive the first digital signal from the ADC, wherein the frequency of the sample signal is less than a Nyquist frequency for the analog signal, and wherein the controller generates a second digital signal from the first digital signal by employing a box constrained linear optimization process, and wherein the second digital signal is approximately equal to an analog-to-digital conversion of the analog signal at the Nyquist frequency for the analog signal,
   wherein the ADC further comprises a successive approximation register (SAR) ADC.

2. The apparatus of claim 1, wherein the SAR ADC further comprises:
   a sample-and-hold (S/H) circuit that is configure to receive analog signal and the sample signal;
   a comparator that is coupled to the S/H circuit;
   SAR logic that is coupled to the comparator and the controller; and
   a capacitive digital-to-analog converter (CDAC) that is coupled to the SAR logic and the comparator.

3. The apparatus of claim 2, wherein the controller provides a clocks signal to the SAR logic and the comparator.

4. The apparatus of claim 3, wherein the box constrained linear optimization processes minimizes a frequency sparse signal ($\vec{\alpha}$) subject to the following constraint:

$$|y_i - (\overline{A}\vec{\alpha})_i| \le e_i, i=1,\ldots,M$$

where y is the second digital signal, $\overline{A}$ is the measurement matrix, e is an error, and M is the number of measurments.

5. The apparatus of claim 4, wherein the controller further comprises a processor having a memory with a computer program embodied thereon.

6. A method comprising:
   converting an analog signal to a first digital signal at a sampling frequency that is less than a Nyquist frequency for the analog signal; and
   constructing a second digital signal from the first digital signal with a box constrained linear optimization process such that the second digital signal is approximately equal to an analog-to-digital conversion of the analog signal at the Nyquist frequency for the analog signal,
   wherein the step of converting further comprises:
   sampling the analog signal at a plurality of sampling instants; and
   determining a digital value for the analog signal at each sampling instant by successive approximation.

7. The method of claim 6, wherein the sampling instants occur as non-uniform intervals.

8. The method of claim 7, wherein the box constrained linear optimization processes minimizes a frequency sparse signal ($\vec{\alpha}$) subject to the following constraint:

$$|y_i - (\overline{A}\vec{\alpha})_i| \le e_i,$$

where y is the second digital signal, $\overline{A}$ is the measurement matrix, and e is an error.

\* \* \* \* \*